United States Patent
Sompur et al.

(10) Patent No.: US 7,161,402 B1
(45) Date of Patent: Jan. 9, 2007

(54) PROGRAMMABLE DELAY LOCKED LOOP

(75) Inventors: Shivakumar Sompur, Sunnyvale, CA (US); Xiaojun Zhu, Milpitas, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/129,681

(22) Filed: May 13, 2005

(51) Int. Cl.
H03L 7/06 (2006.01)

(52) U.S. Cl. ................................. 327/158; 327/161

(58) Field of Classification Search ............... None
See application file for complete search history.

(56) References Cited

U.S. PATENT DOCUMENTS

| | | | | |
|---|---|---|---|---|
| 6,373,301 B1 * | 4/2002 | Chen et al. | ........... | 327/141 |
| 6,501,312 B1 * | 12/2002 | Nguyen | ........... | 327/161 |
| 6,590,434 B1 * | 7/2003 | Chung et al. | ........... | 327/277 |
| 6,791,381 B1 * | 9/2004 | Stubbs et al. | ........... | 327/156 |
| 6,839,860 B1 * | 1/2005 | Lin | ........... | 713/401 |
| 6,919,750 B1 * | 7/2005 | Kawahito et al. | ........... | 327/295 |
| 6,999,547 B1 * | 2/2006 | Braceras et al. | ........... | 375/371 |
| 7,030,675 B1 * | 4/2006 | Wang et al. | ........... | 327/262 |
| 7,057,429 B1 * | 6/2006 | Kim | ........... | 327/149 |

* cited by examiner

Primary Examiner—Timothy P. Callahan
Assistant Examiner—Cassandra Cox
(74) Attorney, Agent, or Firm—Martine Penilla & Gencarella, LLP

(57) ABSTRACT

A delay lock loop (DLL) system includes a master DLL and at least one slave DLL. The master DLL comprises a master delay line, a phase detector, and a loop controller. The master delay line of the master DLL includes four quarter cycle delay lines (QCDL). The slave DLL comprises a delay line and a fractional bit delay element. The delay line of the slave DLL is controlled by the slave delay line control signal generated by the loop controller of the master DLL. The final output of the slave DLL is formed such that the output of the delay line of the slave DLL is corrected by the fractional bit delay generated by the factional bit delay element such that the final output of the slave DLL has a finer delay line resolution than the one of the output of the delay line of the slave DLL.

24 Claims, 6 Drawing Sheets

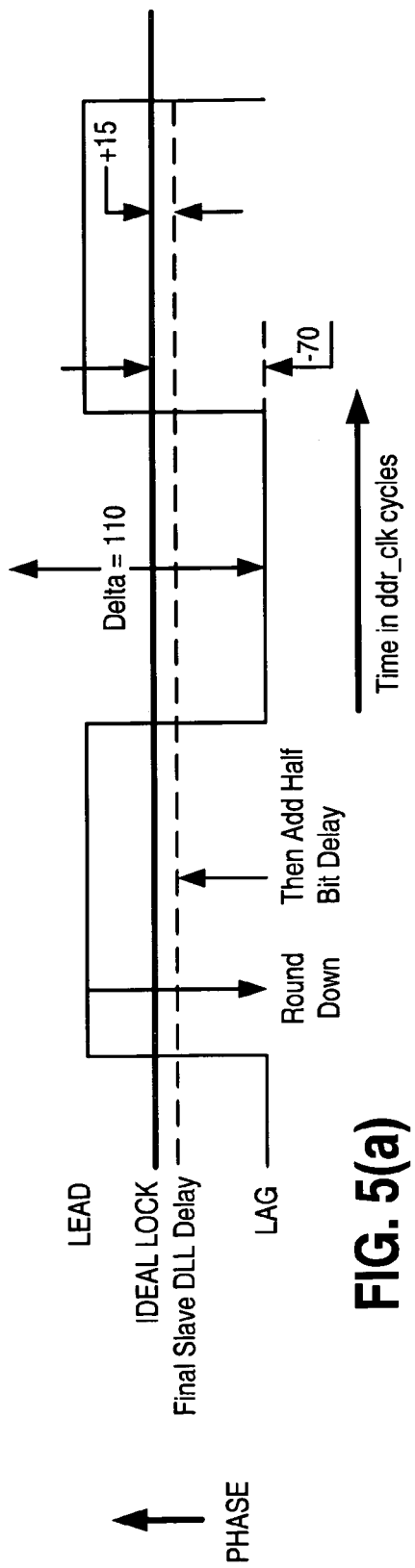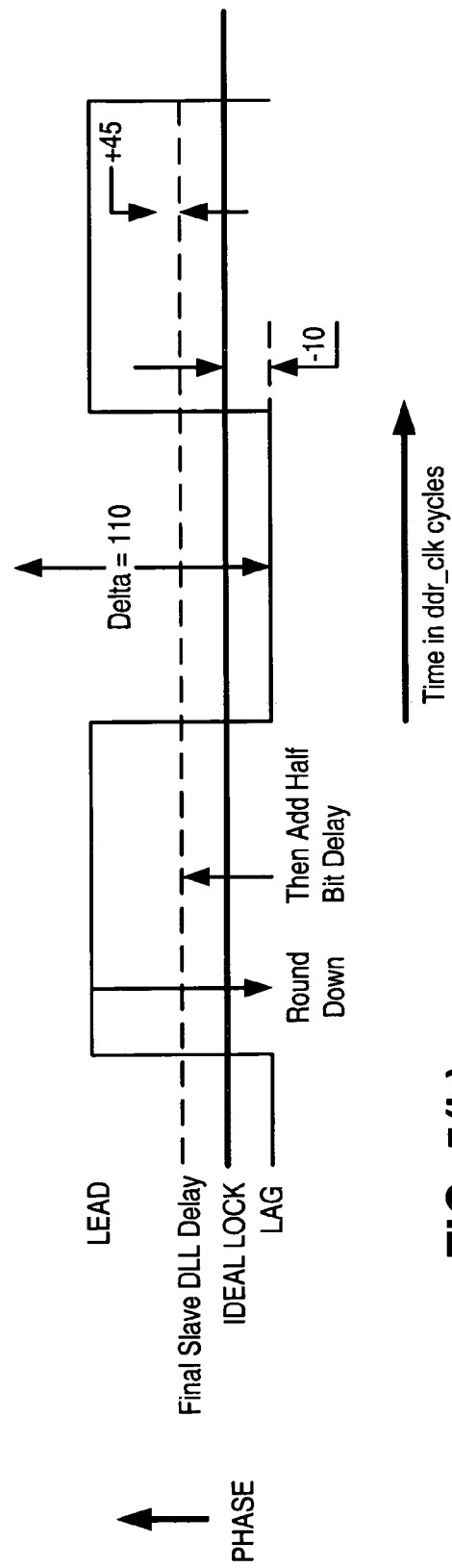

PROGRAMMABLE DELAY LOCKED LOOP

BACKGROUND

1. Field of the Invention

The present invention relates generally to delay locked loops (DLL) in a computer system, and more particularly, to a system and a method for achieving a programmable delay for a DLL system in a double-data-rate (DDR) memory interface.

2. Description of the Related Art

A typical computer system includes at least a microprocessor and some form of memory. During a program execution, the microprocessor of the computer system constantly needs to access data from the memory of the computer system. The memory of the computer system is normally classified as the internal memory located inside the microprocessor and the external memory located outside the microprocessor. When reading the data, the microprocessor normally checks its internal memory first. If the data required is not located inside the internal memory, the microprocessor will try to search the external memory for the data. After the data is found in the external memory, the data will be transferred from its external memory to its internal memory.

A double-data-rate (DDR) device is typically used as the memory interface between the internal memory and the external memory of the computer system. The DDR memory interface normally includes a DLL system that delays either a strobe or a data signal such that the data transferred from the external memory to the internal memory can be latched in the center of the data eye using the strobe as a clock signal. The DLL system consists of a plurality of DLLs, each of which is capable of generating a pre-defined delay.

More DLLs in a DLL system mean that the DLL system will require more space and consume more power, which is not desired in the modern computer system design. In addition, the fixed pre-defined delay generated by each DLL of the DLL system is hardly able to accommodate the DDR timing change requirement during the data transfer, because the DDR timing is usually process/voltage/temperature dependent.

In view of the foregoing, there is a need for a DLL system that can generate better throughput and a programmable delay for each DLL of the DLL system.

SUMMARY

Broadly speaking, the present invention fills this need by providing a delay locked loop (DLL) system that includes a master DLL and at least one slave DLL such that the final output of each slave DLL has finer delay line resolution and the delay generated by each slave DLL is programmable.

In accordance with one aspect of the present invention, a DLL system is provided. The DLL system includes at least one slave DLL and a master DLL that is in communication with the at least one slave DLL. Each slave DLL includes a quarter cycle delay line (QCDL) plus a fractional bit delay element. The master DLL includes four of the QCDLs of the slave DLL, and the four QCDLs delay input clock signal of the master DLL by one clock cycle. The slave DLL is controlled by the master DLL that dictates an amount of the delay the slave DLL should have. The delay generated by the slave DLL has an increased resolution assisted by the fractional bit delay element of the slave DLL.

In accordance with another aspect of the present invention, a DLL system is provided. The DLL system includes a master DLL and at least one slave DLL. The master DLL includes a master delay line, a phase detector, and a loop controller. The master delay line of the master DLL comprises four QCDLs, each of which is capable of generating one quarter cycle of delay. The master delay line inputs a clock signal and outputs a delayed feedback clock signal to the phase detector. The phase detector compares the feedback clock signal with the clock signal and outputs the phase comparison result. The loop controller generates a master delay line control signal and a slave delay line control signal, based upon the phase comparison result. The master delay line control signal controls the master delay line.

The slave DLL includes a delay line and a fractional bit delay element. The delay line of the slave DLL is controlled by the slave delay line control signal generated by the loop controller of the master DLL. The fractional bit delay element generates a fractional bit delay. The output of the delay line of the slave DLL is corrected by the fractional bit delay generated by the fractional bit delay element of the slave DLL to form a final output of the slave DLL. The final output of the slave DLL has a finer delay line resolution than the output of the delay line of the slave DLL.

In accordance with yet another aspect of the present invention, a DLL is presented. The DLL includes a delay line and a fractional bit delay element. The delay line of the DLL comprises a fixed delay line and a variable delay line that includes a number of one-bit delay elements. The fractional bit delay element generates a fractional bit delay. The output of the delay line of the DLL is corrected by the fractional bit delay generated by the fractional bit delay element to form the final output of the DLL. The delay line resolution of the final output of the DLL is more than one of the outputs of the delay line of the DLL. The delay line resolution of the output of the delay line of the DLL is defined by the amount of the delay provided by each of the one-bit delay elements of the variable delay line of the delay line, while the delay line resolution of the final output of the DLL is defined by the amount of the delay provided by the fractional bit delay element.

In accordance with a further aspect of the present invention, a method for generating a final output of a DLL is provided. First of all, the DLL is provided. The DLL includes a delay line and a fractional bit delay element. The fractional bit delay element is connected with the delay line of the DLL. After an input signal is applied to the delay line of the DLL, an output of the delay line of the DLL is obtained. The obtained output of the delay line of the DLL is then corrected by the fractional bit delay generated by the fractional bit delay element to form a final output for the DLL.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 5(a) is a diagram showing a final slave DLL delay after the half-bit delay correction under a favorable condition in accordance with one embodiment of the present invention.

FIG. 5(b) is a diagram showing the final slave DLL delay after the half-bit delay correction under an unfavorable condition in accordance with one embodiment of the present invention.

DETAILED DESCRIPTION

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

The present invention discloses DLL systems and methods to increase the delay line resolution for the final output of each of the slave DLLs in a DLL system. The increased delay line resolution of a slave DLL is assisted by a fractional bit delay element of a slave DLL. The present invention provides an increased delay line resolution (also referred to herein as finer "resolution") with smaller intervals for each of the slave DLLs in a DLL system. The delay line resolution of the final output of a slave DLL is defined by the amount of delay provided by the factional bit delay element of a slave DLL.

Figure 1:
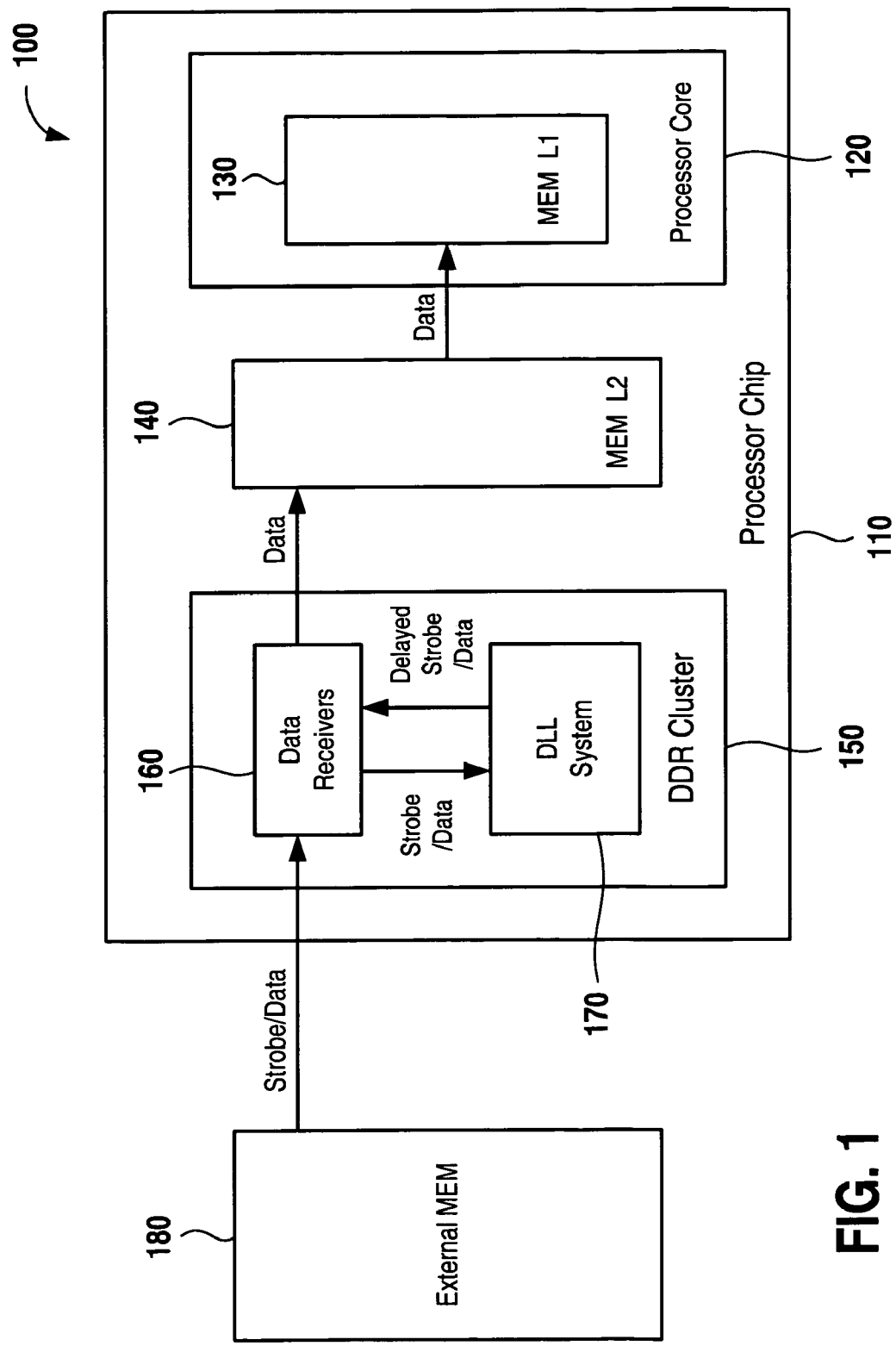
FIG. 1 shows an exemplary read process for a computer system in accordance with one embodiment of the present invention.

FIG. 1 shows an exemplary read process for a computer system 100 in accordance with one embodiment of the present invention. As shown, the processor chip 110 of the computer system 100 includes a processor core 120, an internal memory L1 130 located inside the processor core 120, an internal memory L2 140 located inside the processor chip 110 and outside the processor core 120, a double-data-rate (DDR) cluster 150, and an external memory 180. The DDR cluster 150, acting as a memory interface between the external memory 180 and the internal memory L2 140, further includes data receivers 160 and a delay locked loop (DLL) system 170.

When the computer system 100 needs to read data during a program execution, the processor core 120 will read data from its internal memory L1 130 first. If the data required by the processor core 120 is not located inside the internal memory L1 130, the internal memory L2 140 will be read next. If the data required does not reside inside the internal memory L2 140, the processor chip 110 will search the data from its external memory 180. After the data is found inside the external memory 180, the strobe/data signals are sent to the data receivers 160, which in turn sends the strobe/data signals to the DLL system 170 of the DDR cluster 150. The DLL system 170 of the DDR cluster 150 will delay the strobe/data signals received from the external memory 180 by a certain percentage of cycle delay. In one embodiment, the percentage of the cycle delay for the strobe/data signals is about one quarter (¼) cycle plus a resolution error. The data received by the data receivers 160 will be latched by the strobe after delaying either strobe/data signal using the DLL system 170, and then be transferred into the internal memory L2 140 or to the internal memory L1 130 through the internal memory L2 140.

Figure 2:
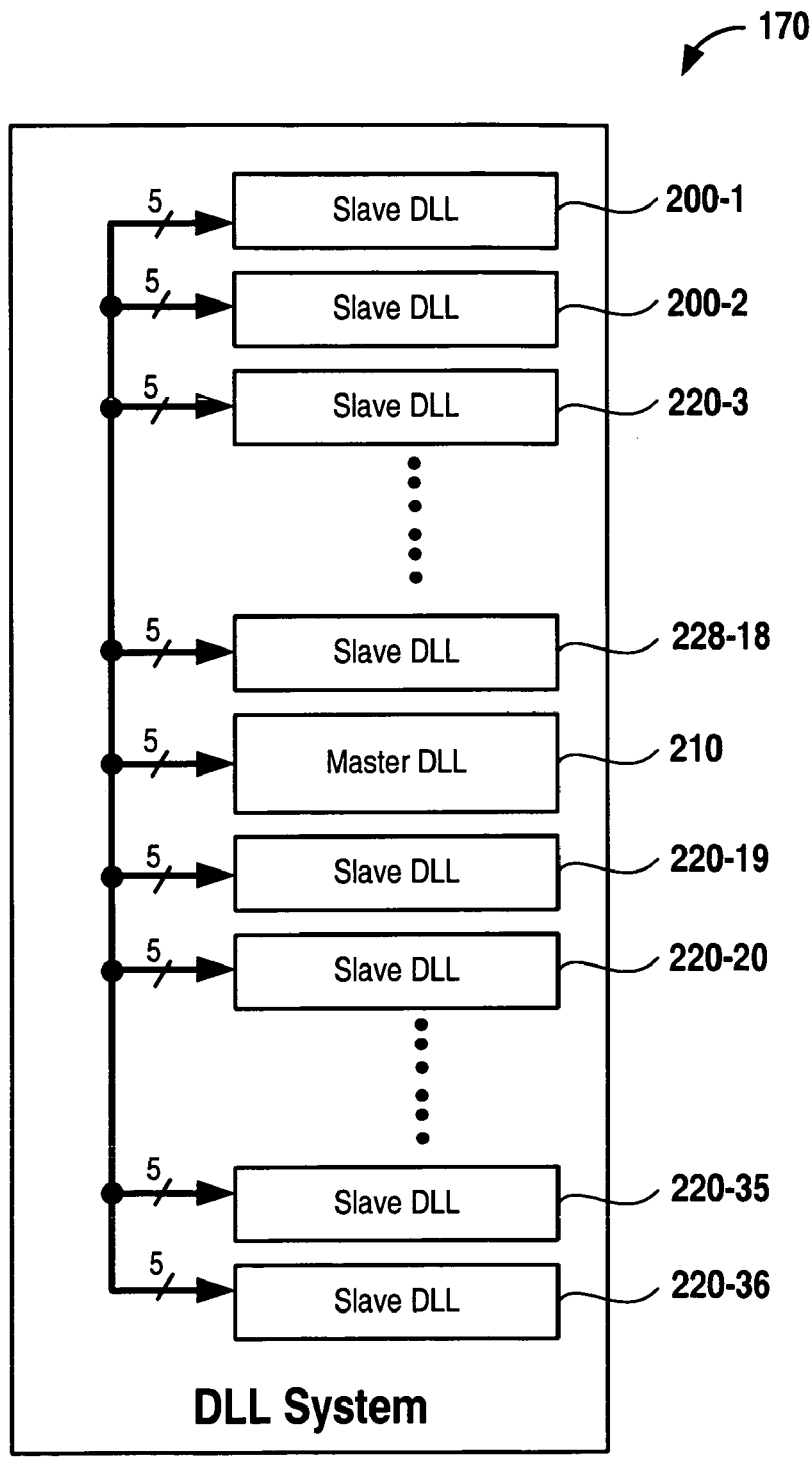
FIG. 2 shows an exemplary DLL system of a DDR cluster for a computer system in accordance with one embodiment of the present invention.

FIG. 2 shows an exemplary DLL system 170 of the DDR cluster 150 for the computer system 100 in accordance with one embodiment of the present invention. The DLL system 170 includes a master DLL 210 and thirty-six slave DLLs (220_1 to 220_36). Each salve DLL will receive a 5-bit control signal from the mater DLL 210. Repeaters (not shown) of the DLL system 170 can be placed periodically to assist driving the 5-bit control signals from the master DLL 210 to each of the thirty-six salve DLLs.

Figure 3:
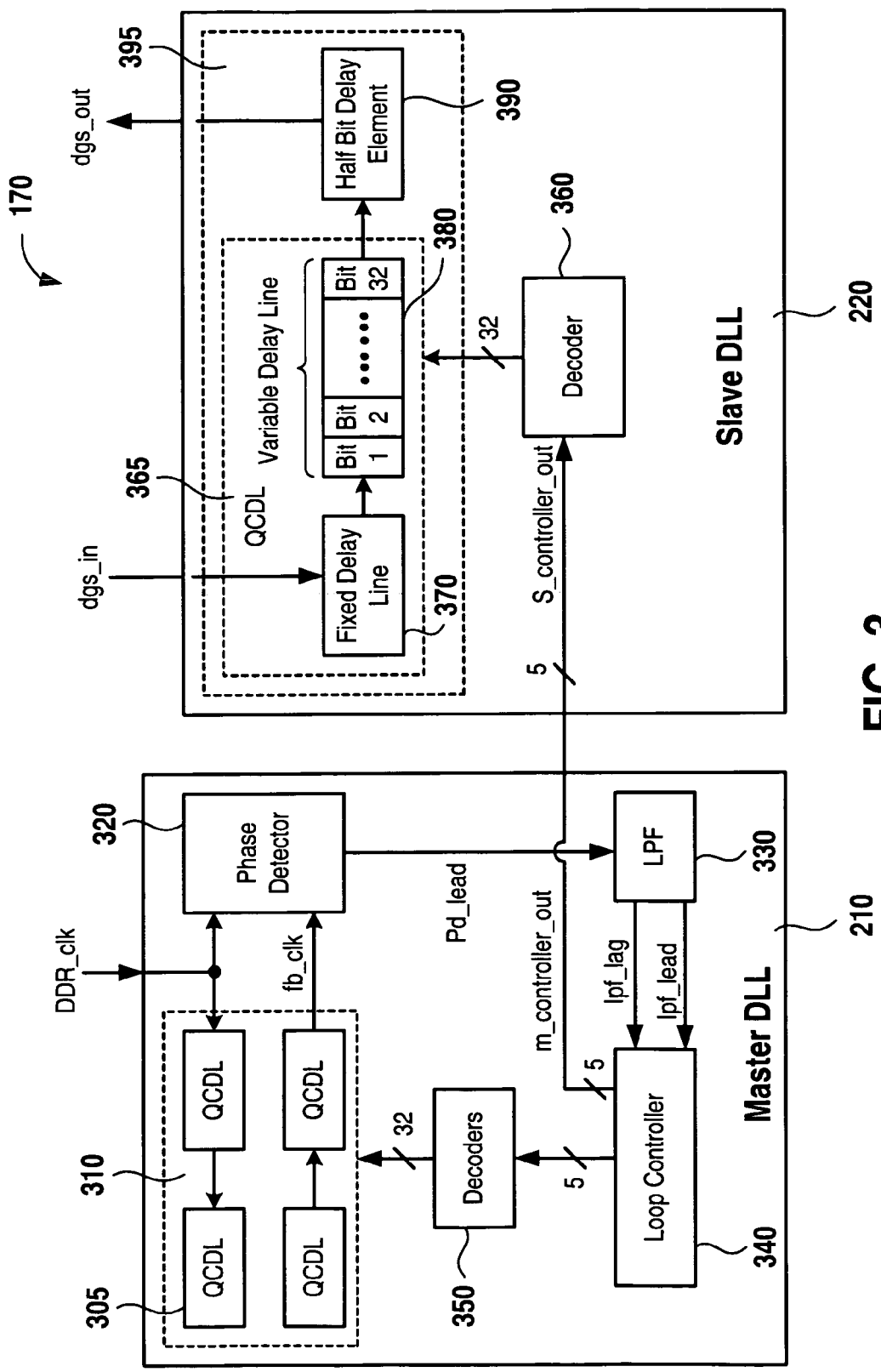
FIG. 3 shows an exemplary detailed layout of a DLL system in accordance with one embodiment of the present invention.

FIG. 3 shows an exemplary detailed layout of the DLL system 170 in accordance with one embodiment of the present invention. Only one slave DLL of the DLL system 170 is shown in FIG. 3, and it is labeled as the slave DLL 220.

As shown, the master DLL 210 comprises a master delay line 310, a phase detector 320, a low pass filter (LPF) 330, a loop controller 340, and decoders 350. The master delay line 310 includes four quarter cycle delay lines (QCDL) 305, each of which delays the input clock signal "DDR_clk" by one quarter cycle. Thus, the master delay line 310 will delay the "DDR_clk" by one full clock cycle under steady state conditions and output the feedback clock signal "fb_clk" to the phase detector 320.

The phase detector 320 compares the "DDR_clk" and the "fb_clk", and outputs the phase comparison result "pd_lead" that is active high only when the "fb-clk" leads the "DDR_clk". The LPF 330 averages the phase comparison result "pd_lead" over a certain number of "DDR_clk" cycles to diminish signal jitter, and generates averaged phase comparison results "lpf_lead" and "lpf_lag" that are, in one embodiment, complementary to each other. The number of "DDR_clk" cycles is about 8 "DDR_clk" cycles in one embodiment. The loop controller 340, being the "brain" of the master DLL 210, processes the averaged phase comparison results "lpf_lead" and "lpf_lag" and outputs the 5-bit master delay line control signal "m_controller_out" and the 5-bit slave delay line control signal "s_controller_out". The decoders 350 will decode the 5-bit control signal "m_controller_out" and feed the 32-bit decoder outputs to the QCDLs in the master delay line 310.

The slave DLL 220 comprises a decoder 360 and a slave delay line 395. The slave delay line 395 includes a fixed delay line 370, a variable delay line 380, and a half-bit delay element 390, wherein the fixed delay line 370 and the variable delay line 380 forms a QCDL 365. The slave delay line 395 of the slave DLL 220 inputs the signal "dqs_in" (the strobe signal or the data signal from the external memory 180) and outputs the delayed signal "dqs_out". The constant delay generated by the fixed delay line 370 is incorporated in the final delay of the slave delay line 395, whereas the delay generated by the variable delay line 380, controlled by the decoded slave delay line control signal "s_controller_out", changes in order to track process, voltage, and temperature (PVT) variations. The decoder 360 will decode the 5-bit slave delay line control signal "s_controller_out"

from the master DLL 210 and feeds the 32-bit decoder outputs to the QCDL 365 of the slave delay line 395.

In one embodiment, the QCDL 365 of the slave DLL 220 is identical to each of the four QCDLs 305 of the master DLL 210, replicating the delay generated by each of the four QCDLs 305 of the master delay line 310 (one quarter cycle of delay). In this case, each of the four QCDLs 305 of the master DLL 210 includes a fixed delay line and a variable delay line (not shown). The instruction for each of the four QCDLs 305 of the master delay line 310 is encoded in the master delay line control signal "m_controller_out" so that the delay generated by each variable delay line of each of the four QCDLs 305 varies in order to track PVT variations.

The variable delay line 380 of the slave DLL 220 includes 32 one-bit delay elements, each of which provides one-bit delay. The delay generated by the variable delay line 380 depends on how many bits are included in the delay, and the inclusion or exclusion of a one-bit delay element of the variable delay line 380 is determined by the decoded 32-bit control signal output from the decoder 360. However, the bit 32 delay element of the variable delay line 380 is included in the final delay of the QCDL 365 of the slave DLL 220.

The half-bit delay element 390 of the slave DLL 220 is similar to the one-bit delay element found in the variable delay line 380 except for its reduced channel length. The half-bit delay element 390 will provide a half-bit delay correction to the output phase of the QCDL 365 so that the final delay of the slave delay line 395 of the slave DLL 220 has finer resolution than the output phase of the QCDL 365.

Figure 4:
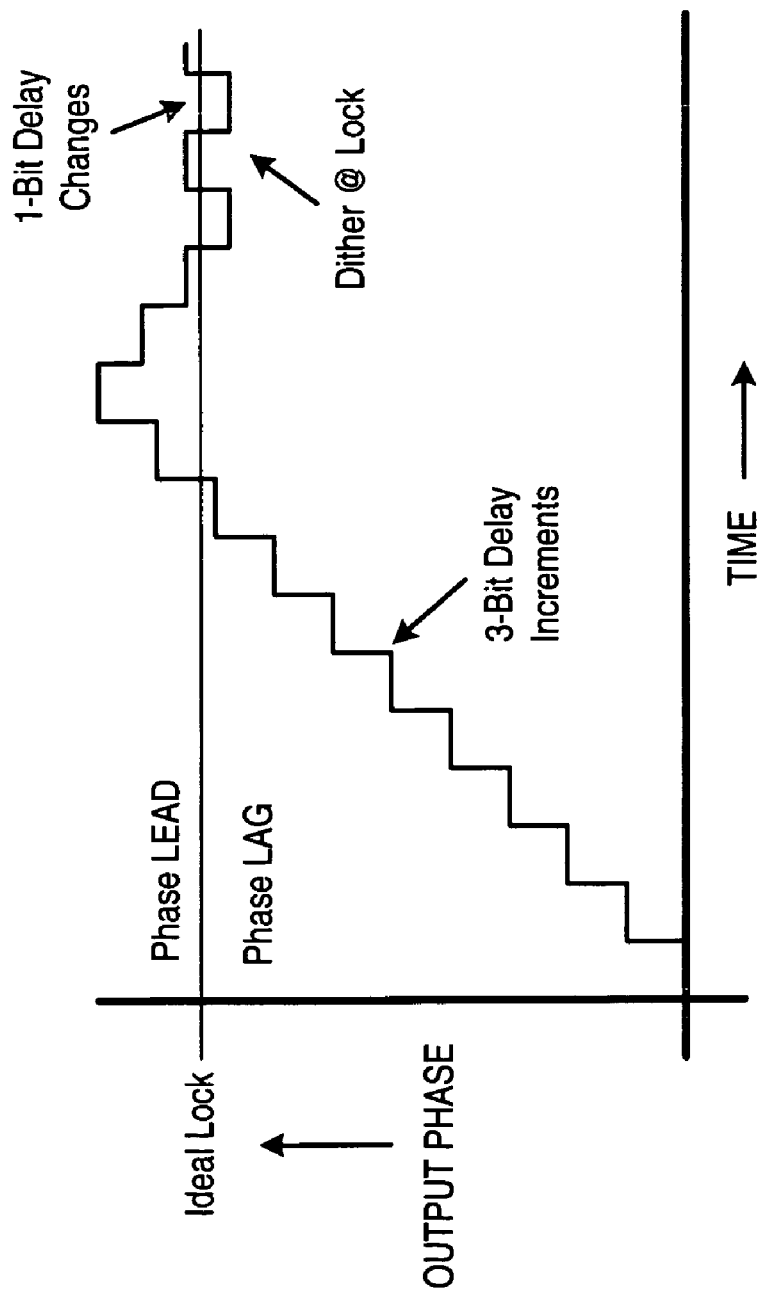
FIG. 4 is a diagram showing the output phase of a master delay line of a master DLL in accordance with one embodiment of the present invention.

FIG. 4 is a diagram showing the output phase of the master delay line 310 of the master DLL 210 in accordance with one embodiment of the present invention. As mentioned above, the master delay line 310 of the master DLL 210 is controlled by the master delay line control signal "m_controller_out" generated by the loop controller 340. The loop controller 340 encodes the phase increment or decrement instructions in the master delay line control signal "m_controller_out".

Initially during a startup period for the master DLL 210, the loop controller 340 instructs the master delay line 310 to increase its output delay with a 3-bit delay increment until the output phase of the master delay line 310 of the master DLL 210 is over the ideal lock position (phase lead position). The 3-bit delay increment accelerates the phase lock speed by including three one-bit delay elements from each variable delay line of each of the four QCDLs 305 of the master delay line 310. As a result, the lock time for the master DLL 210 is less than 1 microsecond even in the worst case for the current implementation.

After the output phase of the master delay line 310 is in the phase lead position, the master delay line 310 is instructed by the loop controller 340 to decrease the phase by one-bit delay until the output phase is less than the ideal lock position (phase lag position). Once the output phase of the master delay line 310 is in the phase lag position, the loop controller 340 will then instruct the master delay line 310 to add one-bit delay to increase the delay for the output phase. Hence, in one embodiment, the master delay line 310 does not truly lock its output phase but instead always oscillates between phase lag and phase lead positions. As shown in FIG. 4, the final output phase of the master delay line 310 will always dither between either phase lead and phase lag positions of the idea lock position, and the delay change of the final output phase of the master delay line 310 is restricted to one-bit delay. When the output phase of master delay line 310 of the master DLL 210 oscillates between phase lag and phase lead positions, the master DLL 210 is defined to be in the lock. The one-bit delay change of the output phase of the master delay line 310 is caused by adding or subtracting a one-bit delay element of each variable delay line of each of the four QCDLs 305 of the master delay line 310.

The master DLL 210 can be in a true lock or a false lock. Because the master delay line 310 of the master DLL 210 is designed to delay its input "DDR_clk" by one cycle, a true lock of the master DLL 210 happens when the output phase "fb_clk" generated by the master delay line 310 is locked just after one cycle delay, as compared with its input "DDR_clk". However, the master DLL 210 will be in a false lock when the output phase "fb_clk" generated by the master delay line 310 of the master DLL 210 is locked after two or more cycle delays, as compared with its input "DDR_clk". The false lock of the master DLL 210 is mainly caused by the improper values of the LPF 330 presented to the loop controller 340 after a reset is de-asserted, which can be avoided by not resetting the LPF 330 during a reset process for the master DLL 210 so that the LPF 330 holds the right values after the reset is de-asserted for the rest of the components of the master DLL 210.

The false lock of the master DLL 210 can also occur due to low frequency power supply noise. In such a case, the master DLL 210 tends to go out of lock by steadily incrementing the number of one-bit delays until all of the one-bit delay elements of each variable delay line of each of the four QCDLs 305 are used. This kind of false lock of the master DLL 210 can be overcome by the automatic reset feature processed by the loop controller 340 of the master DLL 210. When the loop controller 340 detects that the master delay line control signal "m_controller_out" contains the instruction to enable the last delay element of each variable delay line of each of the four QCDLs 305, the loop controller 340 recognizes that master delay line 310 of the master DLL 210 has gone out of lock, which enables the loop controller 340 of the master DLL 210 to automatically reset the master DLL 210. Once the master DLL 210 is reset, the master DLL 210 will try to lock again from the beginning.

FIG. 5(*a*) is a diagram showing the final slave DLL delay after the half-bit delay correction under a favorable condition in accordance with one embodiment of the present invention. As mentioned above, the loop controller 340 generates a master delay line control signal "m_controller_out" and a slave delay line control signal "s_controller_out" to the master delay line 310 and the slave delay line 395, respectively. The slave delay line control signal "s_controller_out" is generated by the loop controller 340 by using a "rounding down" algorithm, i.e., the slave delay line control signal "s_controller_out" is equal to the lesser of the current master delay line control signal "m_controller_out" and the previous master delay line control signal "m_controller_out_prev" generated by the loop controller 340. Under steady state conditions, a master delay line control signal that will result the output phase of the master delay line 310 in the phase lead position has larger value than the one that will result the output phase of the master delay line 310 in the phase lag position. As a result, the slave delay line control signal "s_controller_out" is always equivalent to the value of the master delay line control signal that will result the output phase of the master delay line 310 in phase lag position under steady state conditions. The delay difference between the phase lead and phase lag positions for the output phase of the QCDL 365 is about one-bit. The output phase of the QCDL 365 of the slave delay line 395 is added with a half-bit delay in order to obtain the final delay of the slave DLL 220. In this embodiment, the one-bit delay is about 110 ps, while the half-bit delay is about 55 ps. The delay difference between the phase lead and phase lag positions is about 110 ps, and the output phase of the QCDL 365 is about 70 ps lagging the ideal lock position.

Because of the large deviation between the output phase of the QCDL 365 and the ideal lock position, the half-bit delay correction can be performed under a favorable condition. After the half-bit delay correction, the final delay of the slave DLL 220 is about 15 ps lagging the ideal lock position, which is less than the half-bit delay (55 ps). The final delay of the slave DLL 220 has much smaller deviation to the ideal lock position than the deviation of the output phase of the QCDL 365.

FIG. 5(b) is a diagram showing the final slave DLL delay after the half-bit delay correction under an unfavorable condition in accordance with one embodiment of the present invention. As mentioned above, the output phase of the QCDL 365 of the slave DLL 220 is always in the lag position, due to the "rounding down" algorithm used to calculate the slave delay line control signal "s_controller_out".

After the slave delay line control signal "s_controller_out" is decoded by the decoder 360 and then feed to the QCDL 365 of the slave delay line 395, the worst case phase delay that the QCDL 365 can generate is about as much as one-bit delay under steady state conditions. The output phase of the QCDL 365 has a delay line resolution that is defined by the amount of the delay provided by each of the one-bit delay elements in the variable delay line 380 of the slave DLL 220. In one embodiment, the output phase of the QCDL 365 has a delay line resolution of about 110 ps, when the amount of the delay provided by each of the one-bit delay elements of the variable delay line 380 of the slave DLL 220 is about 110 ps.

As shown in FIG. 5(b), the output phase of the QCDL 365 of the slave delay line 395 is always in the lag position, due to the "rounding down" algorithm used to calculate the slave delay line control signal "s_controller_out". Thereafter, the output phase of the QCDL 365 of the slave delay line 395 is added with a half-bit delay to obtain the final delay of the slave DLL 220. The half-bit delay is generated by the half-bit delay element 390 of the slave DLL 220. In this embodiment, one-bit delay is about 110 ps, while half-bit delay is about 55 ps. The delay difference between the phase lead and phase lag positions is about 110 ps, and the output phase of the QCDL 365 before the half-bit delay correction is about 10 ps lagging the ideal lock position.

Because the output phase of the QCDL 365 is very close to the ideal lock position, the half-bit delay correction applied to the output phase of the QCDL 365 is performed under an unfavorable condition. After the half-bit delay correction, the final delay of the slave DLL 220 is about 45 ps leading the ideal lock position. Although the final delay of the slave DLL 220 has more deviation than the output phase of the QCDL 365 due to the half-bit delay correction performed under the unfavorable condition, the deviation of the final output of the slave DLL 220 is still less than half of a bit (55 ps). Because the delay difference of the output phase of the QCDL 365 is about 1 bit and delay difference of the final delay of the slave DLL 220 is less than half of a bit, the final delay of the slave DLL 220 has finer delay line resolution than the output phase of the QCDL 365.

As seen from FIG. 5(a) and FIG. 5(b), the more deviation the output phase of the QCDL 365 of the slave DLL 220 has, the better the final delay of the slave DLL 220 after the half-bit delay correction. No matter the half-bit delay correction is performed under a favorable condition or an unfavorable condition, the final delay of the slave DLL 220 will have a deviation that is less than half-bit delay (55 ps), which is much better than the worst delay case (one-bit delay) of the QCDL 365. As a result, the slave DLL 220 achieves a 64-bit delay line resolution without the use of the 64 one-bit delay elements in the variable delay line 380. Instead, the slave DLL 220 achieves the 64-bit delay line resolution with very little overhead by using the design of the 32 one-bit delay elements in the variable delay line 380 and a half bit delay element 390 connected to the output of the variable delay line 380, which makes the DLL system 170 save almost half of the area. This savings in area also assists in the reduction of power consumption, as compared with the design of 64 one-bit delay elements in the variable delay line. The delay line resolution of the final delay of the slave DLL 220 is defined by the amount of delay provided by the half-bit delay element 390. In one embodiment, the delay line resolution of the final delay of the slave DLL 220 is equal to or less than 55 ps, when the amount of delay provided by the half-bit delay element 390 is about 55 ps. Of course, it should be understood that the interval of 110 ps being cut in half to 55 ps is only an example, and the same benefits can be achieved in other interval sizes, depending on the implementation.

Figure 6:
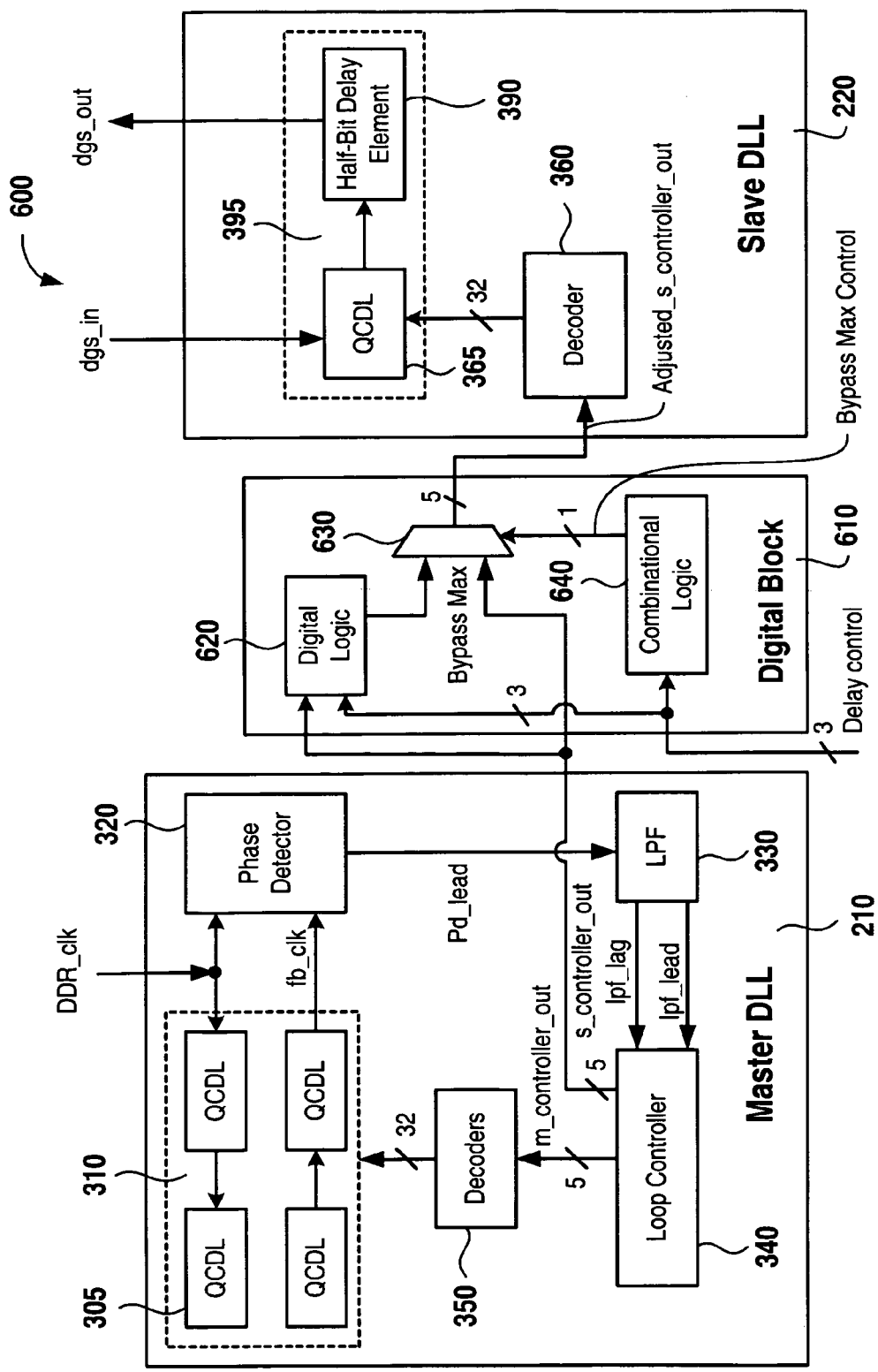
FIG. 6 shows an exemplary DLL system in accordance with one embodiment of the present invention.

FIG. 6 shows an exemplary DLL system 600 in accordance with one embodiment of the present invention. The DLL system 600 includes a master DLL 210, a slave DLL 220, and a digital block 610. Although only one slave DLL 220 is shown, the DLL system 600 is capable of including more than slave DLLs. The master DLL 210 and the slave DLL 220 of the DLL system 600 are the same as the ones in the DLL system 170 in FIG. 3.

In FIG. 3, the QCDL 365 of the slave DLL 220 is capable of delaying its input signal by one quarter cycle. In the DLL system 600, the slave DLL 220 can generate a programmable delay with a desired percentage cycle. As indicated in FIG. 6, a digital block 610 includes a digital logic 620, a bypass MUX 630, and a combinational logic 640. The digital block 610 reads the slave delay line control signal "s_controller_out" coming out of the master DLL 210 and appropriately maps the slave delay line control signal to the slave DLL 220 such that the slave DLL 220 generates a programmable delay with a desired percentage cycle, based on the 3-bit delay control signal received by the combinational logic 640 and the digital logic 620 of the digital block 610.

As shown in FIG. 6, the 5-bit slave delay line control signal "s_controller_out" generated by the loop controller 340 of the master DLL 210 is connected to the digital logic 620 of the digital block 610 and to one of the inputs of the bypass MUX 630. The other input of the bypass MUX 630 is connected to the output of the digital logic 620. The combinational logic 640 of the digital block 610 has a 3-bit delay control signal as its input and outputs a bypass MUX control signal that controls the bypass MUX 630. The bypass MUX 630 will output a 5-bit adjusted slave delay line control signal "adjusted s_controller_out" to the decoder 360 of the slave DLL 220 so that the slave DLL 220 generates a programmable delay with a desired percentage cycle. In one embodiment, the percentage cycle of delay achieved by the slave DLL 220 ranges from about 20% to about 27% cycle of delay in 1% increment.

Table 1 is the mapping table of the digital block 610, which maps the 3-bit delay control signal to the percentage cycle of delay achieved by the slave DLL 220.

TABLE 1

| 3-bit delay control signal | Percentage cycle delay |
|---|---|
| 111 | 24 |
| 110 | 23 |
| 101 | 21 |
| 100 | 25 |
| 011 | 26 |
| 010 | 27 |
| 001 | 20 |
| 000 | 22 |

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A delay locked loop (DLL) system, comprising:
   at least one slave DLL; and
   a master DLL in communication with the at least one slave DLL, each slave DLL including a quarter cycle delay line plus a fractional bit delay element, the master DLL including four of the quarter cycle delay lines of the slave DLL, the four of the quarter cycle delay lines delaying input clock signal by one clock cycle,
   wherein the slave DLL is controlled by the master DLL which dictates an amount of delay the slave DLL should have including an increased resolution assisted by the fractional bit delay element of the slave DLL.

2. The delay locked loop (DLL) system as recited in claim 1, wherein the fractional bit delay element of each slave DLL is a half-bit delay element.

3. The delay locked loop (DLL) system as recited in claim 1, wherein a final output of each slave DLL is generated by adding fractional bit delay generated by the fractional bit delay element of each slave DLL to output of the quarter cycle delay line of each slave DLL.

4. The delay locked loop (DLL) system as recited in claim 3, wherein the final output of each slave DLL has a resolution that is equal to or less than an amount of delay provided by the factional bit delay element of each slave DLL.

5. A delay locked loop (DLL) system, comprising:
   a master DLL including,
      a master delay line having four quarter cycle delay lines, each of the four quarter cycle delay lines being capable of generating one quarter cycle of delay, the master delay line inputting a clock signal and outputting a feedback clock signal that is delayed by one clock cycle as compared with the clock signal;
      a phase detector comparing the clock signal with the feedback clock signal generated by the master delay line and outputting a phase comparison result;
      a loop controller generating a master delay line control signal and a slave delay line control signal based on the phase comparison result generated by the phase detector, the master delay line control signal controlling the master delay line;
   at least one slave DLL controlled by the master DLL, the slave DLL including,
      a delay line being capable of generating an output that delays input of the delay line, the delay line being controlled by the slave delay line control signal generated by the loop controller of the master DLL; and
      a fractional bit delay element that generates a fractional bit delay, the fractional bit delay element being connected with the delay line of the slave DLL such that the output of the delay line of the slave DLL is corrected by the fractional bit delay generated by the fractional bit delay element to form a final output of the slave DLL, the final output of the slave DLL having a finer delay line resolution than one of the output of the delay line of the slave DLL.

6. The delay locked loop (DLL) system as recited in claim 5, wherein the fractional bit delay element of the slave DLL is a half-bit delay element.

7. The delay locked loop (DLL) system as recited in claim 5, wherein the delay line of the slave DLL is identical to each of the four quarter cycle delay lines of the master DLL such that the delay line of the slave DLL replicates the one quarter cycle of delay generated by each of the four quarter cycle delay lines of the master DLL.

8. The delay locked loop (DLL) system as recited in claim 5, wherein the delay line of the slave DLL includes,
   a fixed delay line; and
   a variable delay line that includes a number of one-bit delay elements.

9. The delay locked loop (DLL) system as recited in claim 5, wherein the slave delay line control signal is generated by the loop controller of the master DLL such that the output of the delay line of the slave DLL always lags behind ideal lock.

10. The delay locked loop (DLL) system as recited in claim 9, wherein the final output of the slave DLL is generated by adding the fractional bit delay generated by the fractional bit delay element of the slave DLL to the output of the delay line of the slave DLL.

11. The delay locked loop (DLL) system as recited in claim 5, wherein the master DLL further includes a low pass filter (LPF) that averages the phase comparison result generated by the phase detector of the master DLL during a number of clock cycles and outputs an average phase comparison result to the loop controller of the master DLL.

12. The delay locked loop (DLL) system as recited in claim 11, wherein the number of clock cycles is eight clock cycles.

13. The delay locked loop (DLL) system as recited in claim 11, wherein the LPF remains unchanged during a reset process for the master DLL.

14. The delay locked loop (DLL) system as recited in claim 5, wherein the loop controller of the master DLL is designed such that the loop controller automatically resets the master DLL when the loop controller detects that the master delay line of the master DLL has gone out of lock.

15. The delay locked loop (DLL) system as recited in claim 5, wherein the DLL system further comprises a digital block that connects with the master DLL and the slave DLL such that the digital block inputs the slave delay line control signal of the loop controller of the master DLL and outputs an adjusted slave delay line control signal to the delay line of the slave DLL enabling the delay line of the slave DLL to generate a programmable output with a desired percentage of delay.

16. The delay locked loop (DLL) system as recited in claim 15, wherein the desired percentage of delay of the programmable output of the slave DLL ranges from about 20% to 27% cycle of delay in 1% increment.

17. The delay locked loop (DLL) system as recited in claim 5, wherein the master delay line control signal is generated by the loop controller of the master DLL such that the feedback clock signal of the master delay line of the master DLL is increased with 3-bit increment during a master DLL startup period until the feedback clock signal generated by the master delay line is in phase lead position.

18. A delay locked loop (DLL), comprising:
a delay line having a fixed delay line and a variable delay line that includes a number of one-bit delay elements, output of the delay line having a first clock cycle of delay as compared with input of the delay line, the output of the delay line having a first delay line resolution defined by an amount of delay provided by each of the one-bit delay elements of the variable delay line of the delay line wherein the fixed delay line and the variable delay line are connected in series; and
a fractional bit delay element that generates a fractional bit delay, the fractional bit delay element being connected with the delay line such that the output of the delay line is corrected by the fractional bit delay generated by the fractional bit delay element to obtain a final output of the DLL, the final output of the DLL having a second delay line resolution that is more than the first delay line resolution of the output of the delay line, the second delay line resolution of the final output of the DLL being defined by an amount of delay provided by the factional bit delay element.

19. The delay locked loop (DLL) as recited in claim 18, wherein the fractional bit delay element is a half-bit delay element.

20. The delay locked loop (DLL) as recited in claim 18, wherein the variable delay line of the delay line includes 32 one-bit delay elements.

21. The delay locked loop (DLL) as recited in claim 18, wherein each one-bit delay element of the variable delay line of the delay line is about 110 ps.

22. The delay locked loop (DLL) as recited in claim 21, wherein the first delay line resolution of the output of the delay line is about 110 ps.

23. The delay locked loop (DLL) as recited in claim 21, wherein the second delay line resolution of the final output of the DLL is about 55 ps if the fractional bit delay element is a half-bit delay element.

24. The delay locked loop (DLL) as recited in claim 18, wherein the first clock cycle of delay for the output of the delay line is about one quarter clock cycle.

* * * * *